(12) United States Patent
Chih et al.

(10) Patent No.: US 12,217,819 B2
(45) Date of Patent: Feb. 4, 2025

(54) COMPUTING DEVICE, MEMORY CONTROLLER, AND METHOD FOR PERFORMING AN IN-MEMORY COMPUTATION

(71) Applicant: Taiwan Semiconductor Manufacturing Company, Ltd., Hsinchu (TW)

(72) Inventors: Yu-Der Chih, Hsinchu (TW); Chia-Fu Lee, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 171 days.

(21) Appl. No.: 17/656,425

(22) Filed: Mar. 25, 2022

(65) Prior Publication Data

US 2023/0045840 A1 Feb. 16, 2023

Related U.S. Application Data

(60) Provisional application No. 63/229,814, filed on Aug. 5, 2021.

(51) Int. Cl.
| | |
|---|---|
| *G11C 7/10* | (2006.01) |
| *G11C 7/12* | (2006.01) |
| *G11C 8/08* | (2006.01) |
| *G11C 11/4074* | (2006.01) |

(52) U.S. Cl.
CPC .......... *G11C 7/1048* (2013.01); *G11C 7/1063* (2013.01); *G11C 7/1069* (2013.01); *G11C 7/1096* (2013.01); *G11C 7/12* (2013.01); *G11C 8/08* (2013.01); *G11C 11/4074* (2013.01)

(58) Field of Classification Search
CPC ... G11C 7/1048; G11C 7/1063; G11C 7/1069; G11C 7/1096; G11C 7/12; G11C 8/08; G11C 11/4074
USPC ...................................................... 365/185.25
See application file for complete search history.

(56) References Cited

U.S. PATENT DOCUMENTS

| 10,825,536 B1 | 11/2020 | Yang et al. | |
|---|---|---|---|
| 2009/0317968 A1* | 12/2009 | Nagata | H01L 27/12 257/E21.159 |
| 2019/0340500 A1 | 11/2019 | Olmschenk | |
| 2022/0067499 A1* | 3/2022 | Tran | G06N 3/065 |

FOREIGN PATENT DOCUMENTS

| CN | 112558919 A | * | 3/2021 |
|---|---|---|---|
| CN | 109903162 B | | 5/2021 |
| TW | 202125340 A | | 7/2021 |

* cited by examiner

*Primary Examiner* — Huan Hoang
(74) *Attorney, Agent, or Firm* — Finnegan, Henderson, Farabow, Garrett & Dunner, L.L.P

(57) ABSTRACT

A method for performing an in-memory computation includes: storing data in memory cells of a memory array, the data including weights for computation; determining whether an update command to change at least one of the weights is received; in response to receiving the update command, performing a write operation on the memory array to update the at least one weight; and disabling the write operation on the memory array until receiving a next update command to change the at least one weight.

20 Claims, 7 Drawing Sheets

COMPUTING DEVICE, MEMORY CONTROLLER, AND METHOD FOR PERFORMING AN IN-MEMORY COMPUTATION

REFERENCE TO RELATED APPLICATION

This application claims priority of U.S. Provisional Application No. 63/229,814, filed on Aug. 5, 2021, entitled "MEMORY DEVICE FOR COMPUTING IN MEMORY," the entirety of which is incorporated by reference herein.

BACKGROUND

This disclosure relates generally to memory arrays used in data processing, such as multiply-accumulate operations. Computing-in-memory (or in-memory computing) systems store information in the random-access memory (RAM) of computers and perform calculations at a memory cell level, rather than moving large data between the RAM and data storing units for each computation step. Compute-in-memory technologies allow data to be analyzed in real time because the data stored in RAM can be quickly accessed, which enables faster reporting and decision-making in machine learning applications.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

Figure 1:
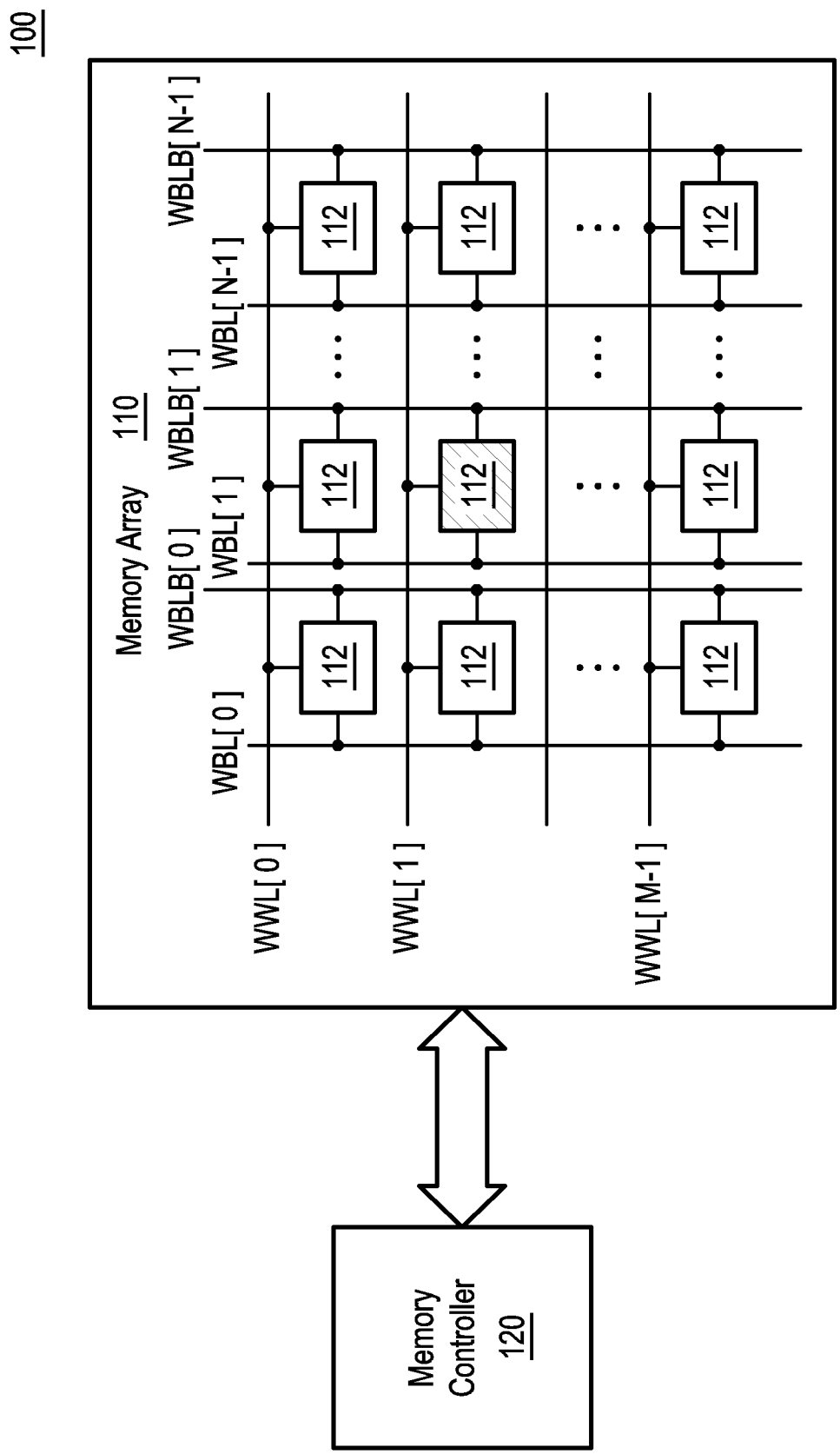
FIG. 1 is a schematic diagram of a representative portion of an exemplary memory device, in accordance with some embodiments of the present disclosure.

The following disclosure provides many different exemplary embodiments, or examples, for implementing different features of the provided subject matter. Specific simplified examples of components and arrangements are described below to explain the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected." "Coupled" and "connected" may also be used to indicate that two or more elements cooperate or interact with each other.

Various embodiments of the present disclosure will be described with respect to embodiments in a specific context, namely computing-in-memory ("CIM") applications. An example of CIM applications is multiply accumulate ("MAC") operations. In MAC operations, numbers in an input array (e.g., a row) are multiplied, or "weighted," by respective elements in another array (e.g., a column) of numbers (e.g., weights), and the products are added together (accumulated) by an accumulator to compute an output sum. This operation is mathematically similar to a dot product (i.e., a scalar product) of two vectors. In the dot product operation, the dot product of two vectors is defined as the sum of the products of component pairs, in which components of two vectors are pair-wise multiplied with each other.

In certain artificial intelligence (AI) systems, such as artificial neural networks, an array of numbers can be weighted by multiple columns of weights. The weighting by each column produces a respective output sum. Accordingly, an artificial intelligence system may produce an output array of sums from an input array of numbers multiplied by the weights in a matrix of multiple columns. In other words, the AI system maps inputs to outputs based on a set of the weights. In various other applications, such as multi-bit convolutional neural network ("CNN") operations, similar operations are employed. When the AI system trains a neural network, the neural network may use various algorithms to update these weights used in MAC operations to find a proper set of weights enabling the neural network to classify the data correctly. In these CIM applications, the power consumption required for updating weights may be significant, and the efficiency of MAC operations is an issue. By reducing the power consumption of SRAM operations updating the weights, the efficiency of MAC operations in CIM applications can be improved accordingly.

FIG. 1 is a schematic diagram of a representative portion of an exemplary memory device 100 in accordance with some embodiments of the present disclosure. As shown in FIG. 1, the memory device 100 includes a memory array 110 and a memory controller 120 configured to perform read or write operations on the memory array 110.

The memory array 110 includes memory cells 112 arranged in M rows and N columns, where M is an integer corresponding to the number of rows and N is an integer corresponding to the number of columns. For example, the memory array 110 may be an array of 256×256 memory cells (112), i.e., memory cells 112 arranged in 256 rows by 256 columns, but the present disclosure is not limited thereto. In various embodiments, M and N may be any integer, such as 16, 32, 64, 128, etc. In addition, the memory array 110 may also be implemented using different types of arrays, including two-dimensional and three-dimensional arrays of various sizes.

In some embodiments, the memory cells 112 can be single port (SP) static random access memory (SRAM) cells, but the present disclosure is not limited thereto. In some embodiments, the memory cells 112 may be dual port (DP) SRAM cells. The memory array 110 may include a single write port or read port, or more than one write port or read port.

In embodiments consistent with FIG. 1, M write word line (WWL) WWL[0]-WWL[M-1] carry signals to activate corresponding rows of the memory cells 112 in the memory array 110. For example, the write word line WWL[0] is electrically connected to WWL terminals of the memory cells 112 that form row 0 of the memory array 110. Similarly, the write word line WWL[1] is electrically connected to WWL terminals of the memory cells 112 that form row 1 of the memory array 110, and the write word line WWL [M-1] is electrically connected to WWL terminals of the memory cells 112 that form row M-1 of the memory array 110.

N write bit lines (WBL) WBL[0]-WBL[N-1] and N write bit lines bar WBLB[0]-WBLB[N-1] carry data signals for storage in selected memory cells 112 in a column in the memory array 110. For example, the write bit line WBL[0] and the write bit line bar WBLB[0] are electrically connected, respectively, to the corresponding WBL and WBLB terminals of the memory cells 112 that form column 0 of the memory array 110. Similarly, the write bit line WBL[1] and the write bit line bar WBLB[1] are electrically connected, respectively, to the corresponding WBL and WBLB terminals of the memory cells 112 that form column 1 of the memory array 110, and the write bit line WBL[N-1] and the write bit line bar WBLB[N-1] are electrically connected, respectively, to the corresponding WBL and WBLB terminals of the memory cells 112 that form column N-1 of the memory array 110. It is noted that the term "bar" used in the context of various embodiments of the present disclosure indicates a logically inverted signal. For example, the write bit line bar WBLB[j] associated with the memory cells 112 in column j, carries a signal logically inverted from a signal carried by the write bit line WBL[j] associated with the memory cells 112 in column J.

During memory operations, the memory controller 120 is electrically connected to the ones of the write word line WWL[0]-WWL[M-1], write bit line WBL[0]-WBL[N-1] and write bit line bar WBLB[0]-WBLB[N-1] corresponding to one of the memory cells 112, and configured to set the voltage values accordingly to read or write data into the corresponding memory cell 112.

In various embodiments, CIM devices can be implemented with the memory device 100 of FIG. 1. For example, the weights for multiply accumulate operations can be stored in the memory cells 112 of the memory array 110. The memory device 100 may be a static random-access memory ("SRAM") device, but the present disclosure is not limited thereto. In an SRAM device, data can be written to, and read from, each SRAM cell, via one or more bit lines ("BLs"), upon activation of one or more access transistors in the SRAM cell by enabling signals from one or more word lines ("WLs"). The SRAM-based CIM design turns on multiple word lines associated with a column of SRAM cells to discharge a common bit line, such as a read bit line ("RBL") to implement a 1-bit MAC operation.

Figure 2:
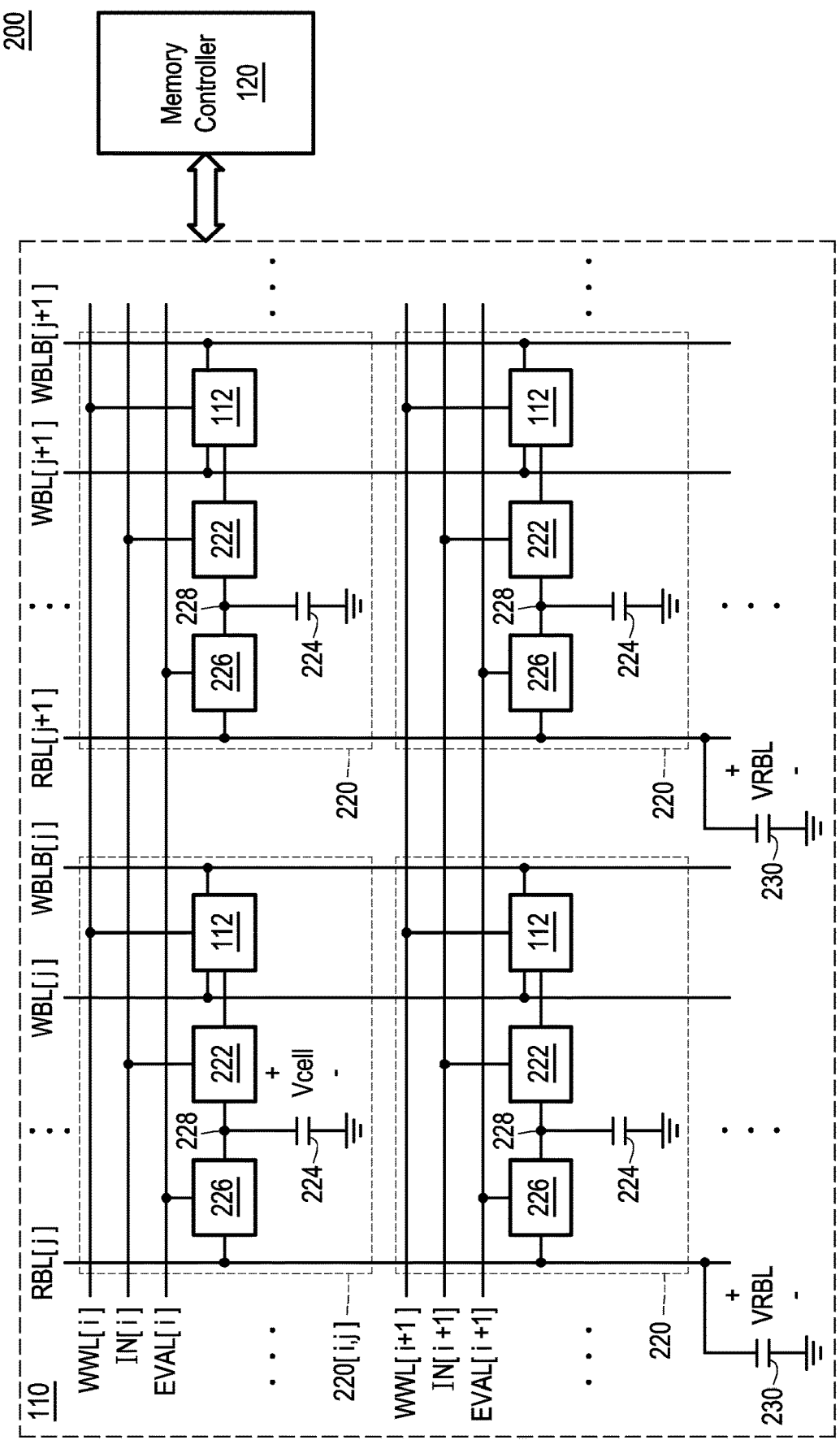
FIG. 2 is a schematic diagram of a representative portion of an exemplary computing-in-memory (CIM) device, in accordance with some embodiments of the present disclosure.

FIG. 2 is a schematic diagram of a portion of an exemplary CIM device 200 in accordance with some embodiments of the present disclosure. As shown in FIG. 2, the CIM device 200 includes the memory array 110 having memory units 220 arranged in rows and columns. Each memory unit 220 includes a corresponding memory cell 112 storing the weight, a first switch device 222, a capacitor 224 having a capacitance (Ccell) and a second switch device 226. Memory units 220 in each row are electrically connected to a corresponding write word line ("WWL"), a corresponding input line ("IN") and a corresponding evaluation control line ("EVAL"), which are controlled by the memory controller 120. Memory units 220 in each column are electrically connected to a corresponding write bit line ("WBL"), a corresponding write bit line bar ("WBLB") and a corresponding read bit line ("RBL"), which are also controlled by the memory controller 120.

The memory unit associated with the corresponding row i and corresponding column j (e.g., the memory unit 220[i,j] in FIG. 2) is used as an example to describe, in the following paragraphs, the structure and circuit of the memory unit 220 and the operations with respect to corresponding signal lines. As shown in FIG. 2, for the memory unit 220[i,j], the memory cell 112 is connected to the write word line WWL[i] associated with the row i and the write bit line WBL[j] and write bit line bar WBLB[j] associated with the column j. When activated by the signal on the write word line WWL [i], the memory cell 112 is configured to input a binary signal indicative a weight ("W") (0 or 1) according to the values of the write bit line WBL[j] and the write bit line bar WBLB[j], and store the weight accordingly.

The first switch device 222 is connected to the memory cell 112 and to an associated input line IN[i] for receiving input signals. The first switch device 222 is controlled by the input signals on the input line IN[i], and selectively turns on or off accordingly to receive the weight from the memory cell 112. For example, when the input signal on the input line IN[i] is logical high ("1"), the first switch device 222 turns ON, and when the input signal on the input line IN[i] is logical low ("0"), the first switch device 222 turns OFF. The weight stored in the memory cell 112 can be passed to the node 228 when the first switch device 222 is ON. The capacitor 224 is connected between the first switch device 222 and a reference voltage (e.g., a ground voltage). The voltage stored by the capacitor 224 is indicative of the product of the input signal on the input line IN[i] and the weight in the corresponding memory cell 112. The second switch device 226 is connected to the associated read bit line RBL[j] and corresponding evaluation control line EVAL[i] and controlled by the signal on the evaluation control line EVAL[i]. The second switch device 226 selectively interconnects the corresponding read bit line RBL[j] and a node 228 where the first switch device 222 and capacitor 224 are connected to each other.

Accordingly, the voltage value sensed on the node 228, also referred to herein as the cell voltage Vcell, is determined by both the state of the first switch device 222 and the weight stored in the memory cell 112. The state of the first switch device 222, in turn, is determined by the input signal received from the input line IN[i]. When the input signal on the input line IN[i] is logical high ("1"), the first switch device 222 is ON and passes the weight stored in the memory cell 112 to the node 228. When the input signal on the input line IN[i] is logical low ("0"), the first switch device 222 is OFF, and a "0" is outputted to the node 228, regardless of the weight stored in the memory cell 112. Thus, the output to the node 228 is the product of the input signal and the weight stored in the memory cell 112. The output of the first switch device 222 can be given by the following Table 1:

TABLE 1

| Input | Weight | Output |
|-------|--------|--------|
| 0 | 0 | 0 |
| 0 | 1 | 0 |
| 1 | 0 | 0 |
| 1 | 1 | 1 |

In some embodiments, before a multiplication operation described above is performed, the voltage, Vcell, at the node 228 for each memory unit 220 is reset by pre-discharging capacitors 224. For example, the discharge of the capacitors 224 can be achieved by turning off the first switch device 222 and turning on the second switch device 226, using corresponding signals on the input lines IN[i] and on the evaluation control lines EVAL[i], and driving the read bit line RBL[j] to 0. Accordingly, in each memory unit 220, a discharging current may flow through the second switch device 226 to reset the voltage Vcell at the node 228 to 0.

Next, after the reset, with the second switch device 226 in each memory unit 220 turned off, the multiplication operation described above is performed. The voltage Vcell at the node 228 for each memory unit 220 is thus indicative of (e.g., proportional to) the product of the input signal on the input line IN[i] and the weight stored in the corresponding memory cell 112.

Next, a voltage VRBL on the read bit line RBL[j] can be obtained. The voltage VRBL is proportional to the sum of the product values (INxW) of all memory units 220 in the corresponding column j associated with the read bit line RBL[j]. For the computation of the sum of the product values, the memory controller 120 can pre-discharge the read bit line RBL[j] to 0 volts and then, by using corresponding signals on the evaluation control lines EVAL[i], EVAL[i+1] . . . , turn on the second switch devices 226 of all memory units 220 to allow the capacitors 224 of the respective memory units 220 in column j to discharge to the read bit line RBL[j]. Thus, the voltage VRBL on the read bit line RBL[j] rises as the capacitors 224 of the memory units 220 in column j discharge. Because the capacitors 224 in the respective memory units 220 in column j are in parallel with each other and with a capacitor 230 coupled between the read bit line RBL[j] and a reference voltage (e.g., ground), the charge is now shared among all capacitors 224. Accordingly, the voltage VRBL on the read bit line RBL[j] is given by equation (1):

$$VRBL = \frac{m \times Ccell \times VDD}{CRBL + n \times Ccell} \quad (1)$$

In equation (1), n is the number of memory units 220 on the same read bit line RBL[j], m is the number of nodes 228 that indicate logical high prior to the charge sharing, Ccell is the capacitance value of each capacitor 224, CRBL is the capacitance value of the capacitor 230 coupled to the read bit line RBL[j], and VDD is the supply voltage. Accordingly, the voltage VRBL on the read bit line RBL[j] represents the sum of the respective products of the input signal and the weights (INxW) in the memory units 220 sharing the same read bit line RBL[j].

When applied to AI applications using a multiply accumulate system as a model, the CIM device 200 can supply a set of input data (e.g., numbers), via the input line IN[i], to the current model. The input data are processed by multiplying each input with the corresponding weight stored in the memory array 110 and accumulating the products together to obtain the output data. The output data are then compared to a target or desired output voltage. If the output data are not close enough to the desired values, the model is adjusted and the process is repeated until the output data are sufficiently close to the desired values. For example, as shown in FIG. 2, the CIM device 200 can include a two-dimensional array of elements arranged in rows and columns, each of the elements storing a weight, and capable of receiving an input and generating an output that is the arithmetic product of the input and the stored weight. The model system can have each input supplied to a row of elements and the outputs of each column of the elements added together.

Figure 3:
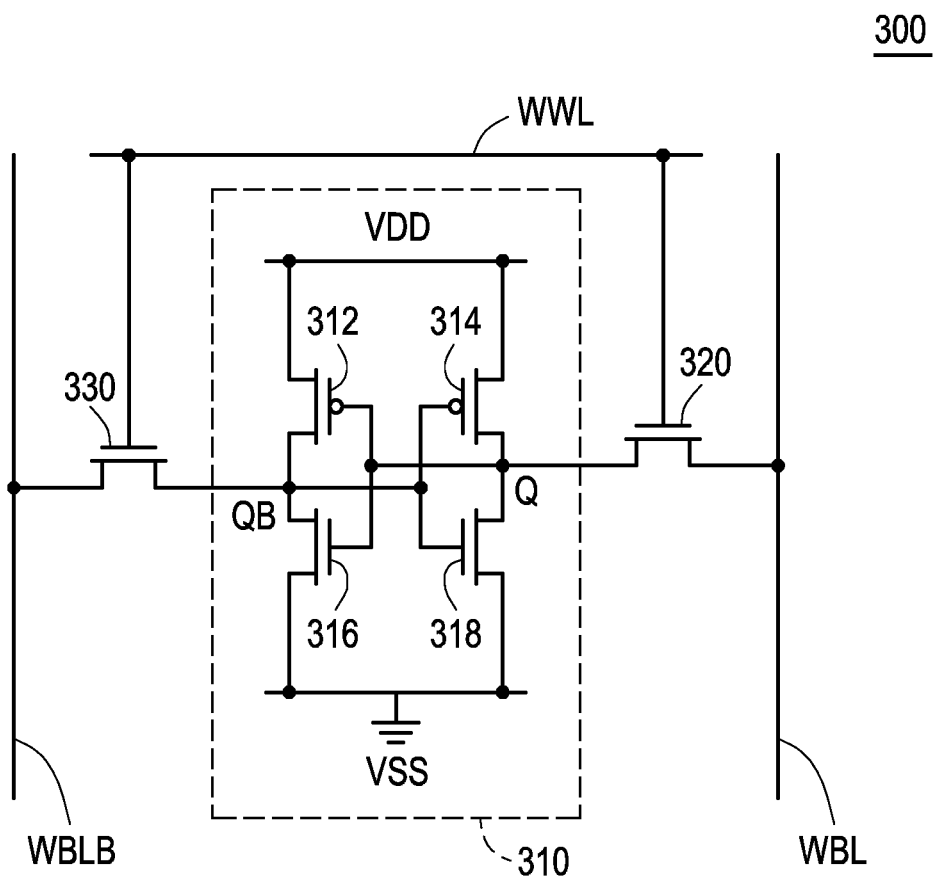
FIG. 3 is a schematic diagram of an exemplary memory cell in accordance with some embodiments of the present disclosure.

FIG. 3 is a schematic diagram of an exemplary memory cell 300 in accordance with some embodiments of the present disclosure. In some embodiments, the memory cell 300 is a six transistor (6T) single port (SP) SRAM memory cell, which can be used to implement the memory cells 112 illustrated in FIG. 1 or FIG. 2. In some other embodiments, the memory cell 300 employs a number of transistors other than six. For example, in some other embodiments, memory cells in the memory device of FIG. 1 may be achieved by 8T SRAM bit cells, 10T SRAM bit cells, or any other types of memory cell. The 6T SRAM cell 300 illustrated in FIG. 3 is exemplary and used to explain the features of the memory cell, but not meant to limit the embodiments of the present disclosure.

As shown in FIG. 3, the memory cell 300 includes a pair of cross-coupled inverters 310, and access transistors 320 and 330 (also known as a pass gate or a pass transistor). The pair of cross-coupled inverters 310 includes two p-type metal oxide semiconductor (PMOS) transistors 312, 314, and two n-type metal oxide semiconductor (NMOS) transistors 316, 318. Source terminals of the PMOS transistors 312, 314 are electrically connected to a power supply voltage (VDD) terminal. Drain terminals of the PMOS transistors 312, 314 are respectively electrically connected to drain terminals of the n-type metal oxide semiconductor (NMOS) transistors 316, 318 at corresponding nodes QB and Q. Source terminals of NMOS transistors 316, 318 are electrically connected to a reference node. As shown in FIG. 3, in some embodiments, the reference node is substantially equal to a logically low signal. For example, the reference node may be substantially equal to a ground voltage (VSS). A gate terminal of PMOS transistor 312 is electrically connected to a gate terminal of NMOS transistor 316 and the respective source/drain terminals of NMOS transistor 318 and PMOS transistor 314. Similarly, a gate terminal of PMOS transistor 314 is electrically connected to a gate terminal of NMOS transistor 318 and the respective source/drain terminals of NMOS transistor 316 and PMOS transistor 312.

The PMOS transistors 312 and 314 can be referred to as pull-up transistors and NMOS transistors 316 and 318 can be referred to as pull-down transistors. Particularly, the PMOS transistors 312 and 314 are configured to pull voltage potential towards the power supply voltage VDD. The NMOS transistors 316 and 318 are configured to pull voltage potential towards the reference node (e.g., the ground voltage VSS).

The access transistor 320 is configured to selectively connect cross-coupled inverters 310 to the write bit line WBL. The access transistor 330 is configured to selectively connect the cross-coupled inverters 310 to the write bit line bar WBLB. The access transistor 320 and the access transistor 330 are both configured to be activated based on a signal on the write word line WWL. As shown in FIG. 3, in some embodiments, the access transistor 320 and the access transistor 330 may be NMOS transistors having gate terminals electrically connected to the write word line WWL, but the present disclosure is not limited thereto. In other embodiments, the access transistor 320 and the access transistor 330 may be implemented by PMOS transistors.

For the memory cell 300 in FIG. 3 having NMOS transistors for the access transistors 320 and 330, the memory cell 300 is connected to the write bit line WBL or the write bit line bar WBLB by a logical high signal at the gate terminal of the access transistor 320 or the access transistor 330. In contrast, if the memory cell 300 instead includes PMOS transistors for the access transistors 320 and 330, the memory cell 300 is connected to the write bit line WBL or the write bit line bar WBLB by logical low signal at the gate terminal of the access transistor 320 or the access transistor 330.

In various embodiments, the memory cell 300 can be of any suitable physical structure. For example, and without limitation, the transistors 312, 314, 316, 318, 320, and 330 in the memory cell 300 can include three-dimensional gate structures, such as fin field-effect-transistors (FinFET).

Figure 4:
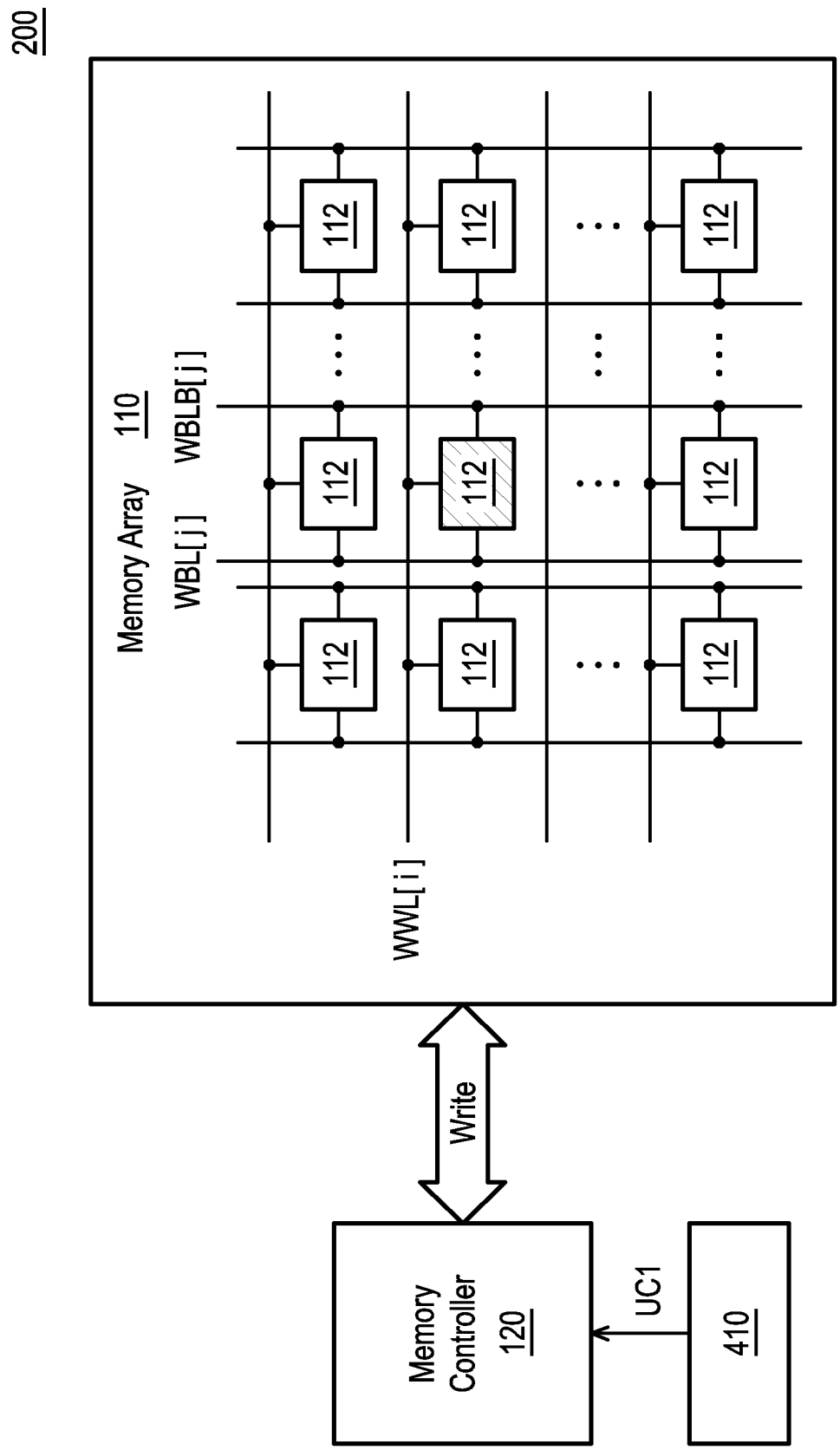
FIG. 4 is an exemplary diagram illustrating memory operations in the CIM device of FIG. 2, in accordance with some embodiments of the present disclosure.

FIG. 4 is an exemplary diagram illustrating memory operations in the CIM device 200 of FIG. 2 in accordance with some embodiments of the present disclosure. In the embodiments of FIG. 4, the SRAM memory cells 112 in the memory array 110 are configured to store weights to be used in the CIM application. The memory controller 120 controls the SRAM memory cells 112, performing write operations to update the weights stored in one or more selected memory cells 112.

As shown in FIG. 4, in some embodiments, the CIM device 200 further includes a command generating circuit 410. The command generating circuit 410 determines whether the weight is changed, and, in response to the weight being changed, provides an update command UC1 associated with the weight being changed. On the other hand, the command generating circuit 410 does not provide the update command UC1 when the weight remains unchanged. In other words, the command generating circuit 410 is configured to output the update command UC1 only when one of the stored weights is replaced with a different weight.

In the embodiments of FIG. 4, the command generating circuit 410 is electrically coupled to the memory controller 120, but the present disclosure is not limited thereto. In some other embodiments, the command generating circuit 410 may be arranged and integrated in the memory controller 120. When a weight is changed, the memory controller 120 receives the update command UC1 to initiate the updating. Accordingly, in response to receiving the update command UC1, the memory controller 120 performs the write operation to the memory array 110 to update the corresponding weight stored in the corresponding memory cells 112. When performing the write operation, in order to write the data to a target memory cell 112 in row i and column j of the memory array 110, the memory controller 120 first pre-charges the write bit line WBL[j] and the write bit line bar WBLB[j] associated with column j to a high voltage (e.g., power supply voltage VDD) during a pre-charge phase before the write cycle starts. Then, as the write cycle begins, the memory controller 120 applies the value to be written to the write bit line WBL[j], and applies the logically inverted value to the write bit line bar WBLB[j].

In other words, the memory controller 120 sets the corresponding write bit line WBL[j] to a first logic value based on an updated weight associated with the update command UC1, and set the corresponding complementary bit line, the write bit line bar WBLB[j], to a second logic value complementary to the first logic value based on the updated weight. For example, when writing data 0, the memory controller 120 is configured to set the write bit line WBL[j] to a logical low signal ("0") and set the write bit line bar WBLB[j] to a logical high signal ("1"). When writing data 1, the memory controller 120 is configured to set the write bit line WBL[j] to the logical high signal ("1") and set the write bit line bar WBLB[j] to the logical low signal ("0"). Accordingly, the data 1 can be written by inverting the values of the write bit line WBL[j] and the write bit line bar WBLB[j].

Then, the memory controller 120 asserts the selected write word line WWL[i] associated with row i by setting the write word line WWL[i] to the logical high signal. Accordingly, the value to be written is latched in. Because the bit line input-drivers are designed to be stronger than the relatively weak transistors in the memory cell 112, the memory controller 120 can override the previous state of the cross-coupled inverter in the memory cell 112.

In order to reduce the power consumption, the memory controller 120 is configured to disable the write operation to the memory array 110, until the next update command UC1 is received. For example, in some embodiments, the memory controller 120 can skip and bypass one or more steps in the write operation described above to disable the write operation. For example, the memory controller 120 can set the write word line WWL[i] to logical zero or set the write word line WWL[i] floating to disable the write operation.

Particularly, during the pre-charge phase, a large charging current is required to charge the write bit line WBL[j] and the write bit line bar WBLB[j] back to the high voltage (power supply voltage VDD). In some embodiments, the memory controller 120 is configured to further disable the write operation until receiving the next update command UC1 by disabling pre-charging the write bit line WBL[j] and the write bit line bar WBLB[j], and disabling setting the values to the write bit line WBL[j] and the write bit line bar WBLB[j]. Accordingly, when the weight does not need to be changed, the write bit line WBL[j] and the write bit line bar WBLB[j] are not charged back to the high voltage (VDD). Thus, the power consumption of the memory device 100 can be reduced. When the weight is changed and should be written into the memory array 110, in response to receiving the update command UC1, the memory controller 120 pre-charges the write bit line WBL[j] and the write bit line bar WBLB[j] again to perform the write operation.

In some embodiments, the memory controller 120 is configured to disable the write operation until receiving next update command UC1 by setting the write word line WWL [i] to logical zero. In some other embodiments, the memory controller 120 may also set the write word line WWL[i] to a floating state to disable the write operation. Accordingly, the write word line WWL[i] is not asserted when the memory controller 120 does not receive the update command UC1. Thus, the write operation on the SRAM memory cells 112 is disabled, until the memory controller 120 receives the update command UC1.

In some embodiments, the SRAM memory cells 112 do not require random access, i.e., do not require data items to be either read or written in the next operation, when the SRAM memory cells 112 store the weights used in the CIM application. In such embodiments, the memory controller 120 can operate in a "write only" mode and disable read operations to reduce power consumption. As discussed above, the memory controller 120 can maintain the write bit line WBL[j] and the write bit line bar WBLB[j] in a previous state, and not charge the write bit line WBL[j] and the write bit line bar WBLB[j] back to the high voltage (VDD). Accordingly, the memory controller 120 may be configured to disable read operations, regardless of whether the update command UC1 is received, to reduce extra power consumption for charging the write bit line WBL[j] and the write bit line bar WBLB[j]. Thus, the total power consumption of the memory operations is reduced, and the efficiency of the MAC operation is improved.

Figure 5:
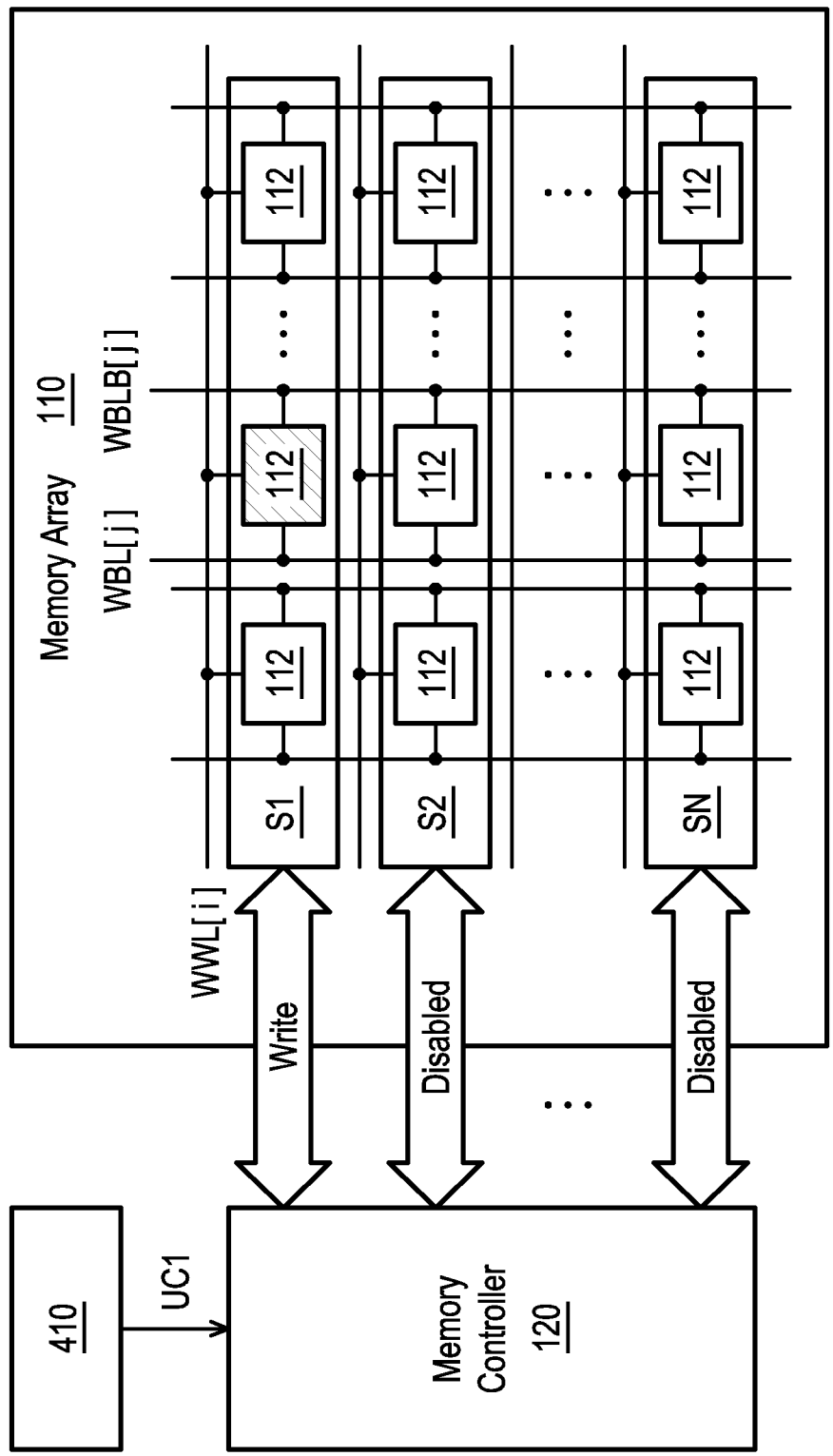
FIG. 5 is another exemplary diagram illustrating memory operations in the CIM device of FIG. 2, in accordance with some embodiments of the present disclosure.

FIG. 5 is another exemplary diagram illustrating memory operations in the CIM device 200 of FIG. 2 in accordance with some embodiments of the present disclosure. As shown in FIG. 5, in some embodiments, the memory cells 112 in the memory array 110 are divided into multiple segments S1, S2, ..., SN. The memory controller 120 may be configured to perform a write operation on a segment S1 in the memory array 110, in response to the update command UC1 associated with the segment S1, and separately disable the write operation on other segments S2-SN separate from the segment S1. Accordingly, when updating the weight stored in the memory cells 112 of the segment S1, the memory controller 120 can reduce the overall power consumption by preventing unnecessary charging currents in the remaining segments S2-SN to improve the efficiency of the MAC operation.

Figure 6:
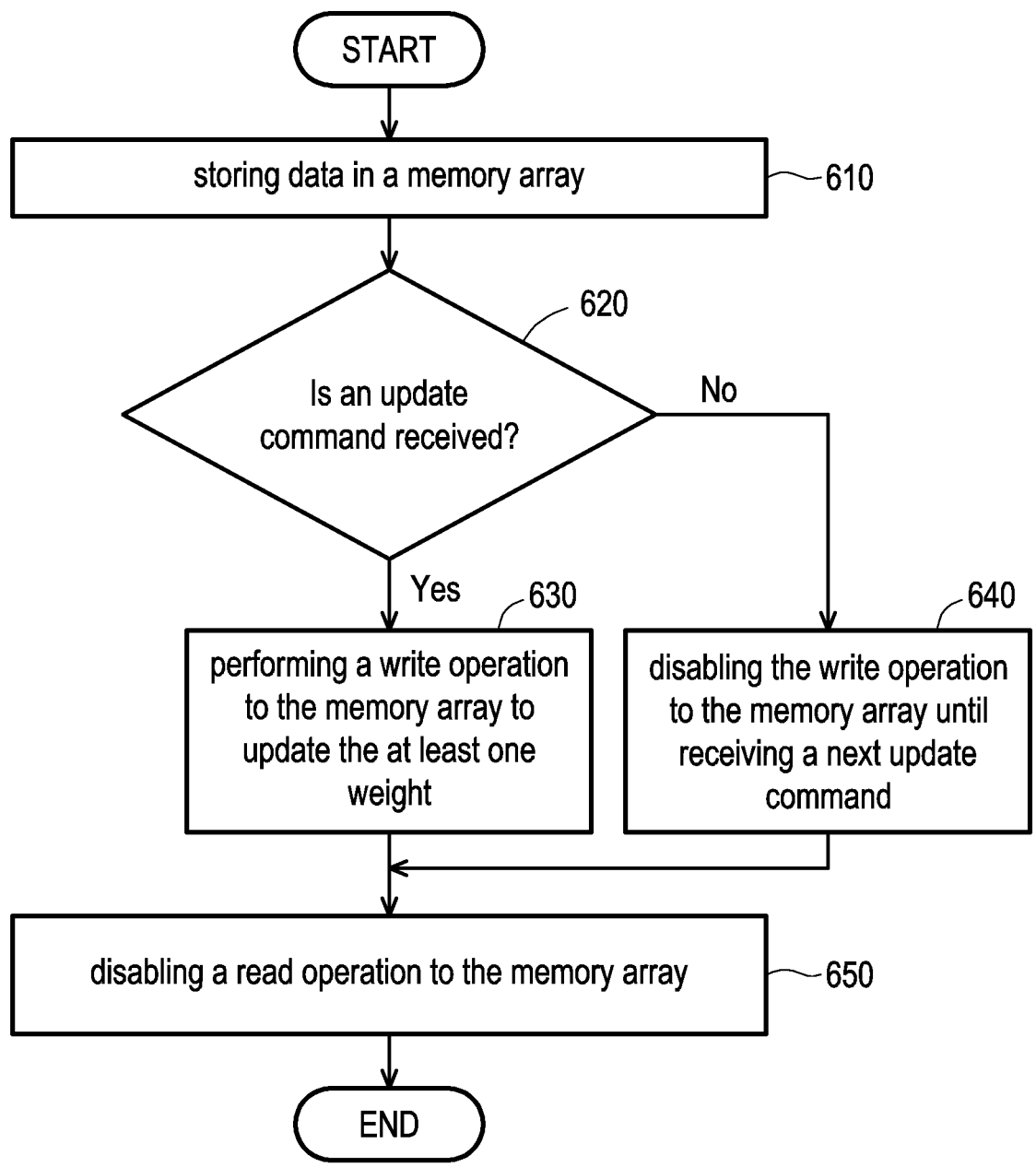
FIG. 6 is an exemplary flowchart of a method of performing an in-memory computation, in accordance with some embodiments of the present disclosure.

FIG. 6 is an exemplary flowchart of a method 600 for performing an in-memory computation, in accordance with some embodiments of the present disclosure. It is understood that additional operations may be performed before, during, and/or after the method 600 depicted in FIG. 6, and that some other operations may only be briefly described herein. The method 600 can be performed for the memory device 100 and the CIM device 200 illustrated in the embodiments of FIGS. 1-5, but the present disclosure is not limited thereto.

In operation 610, a memory controller (e.g., memory controller 120 in FIG. 1) stores data in a memory array (e.g., memory array 110 in FIG. 1). In some embodiments, the data stored in the memory array may include multiple weights for computation, e.g., in an AI system.

In operation 620, the memory controller determines whether an update command (e.g., update command UC1 in FIG. 4) associated with at least one weight being changed is received. In some embodiments, a command generating circuit (e.g., command generating circuit 410 in FIG. 4) in the memory device 100 or the CIM device 200 outputs the update command when one of the weights is replaced with a different weight.

When the memory controller receives the update command (operation 620 —yes), then in operation 630, the memory controller performs a write operation to the memory array to update the weight in response to receiving the update command. In some embodiments, the memory array is divided into multiple segments (e.g., segments S1-SN in FIG. 5), and in operation 630, in response to receiving the update command associated with one target segment to be written (e.g., segment S1 in FIG. 5) in the current cycle, the memory controller performs the write operation on the target segment and separately disables the write operation on remaining segment(s) (e.g., segments S2-SN in FIG. 5) separate from the target segment. In addition, in a following cycle, in response to receiving the update command associated with another target segment to be written (e.g., segment S2 in FIG. 5) the memory controller performs the write operation on the target segment and separately disables the write operation on remaining segment(s) (e.g., segments S1, and S3-SN in FIG. 5) separate from the target segment.

Figure 7:
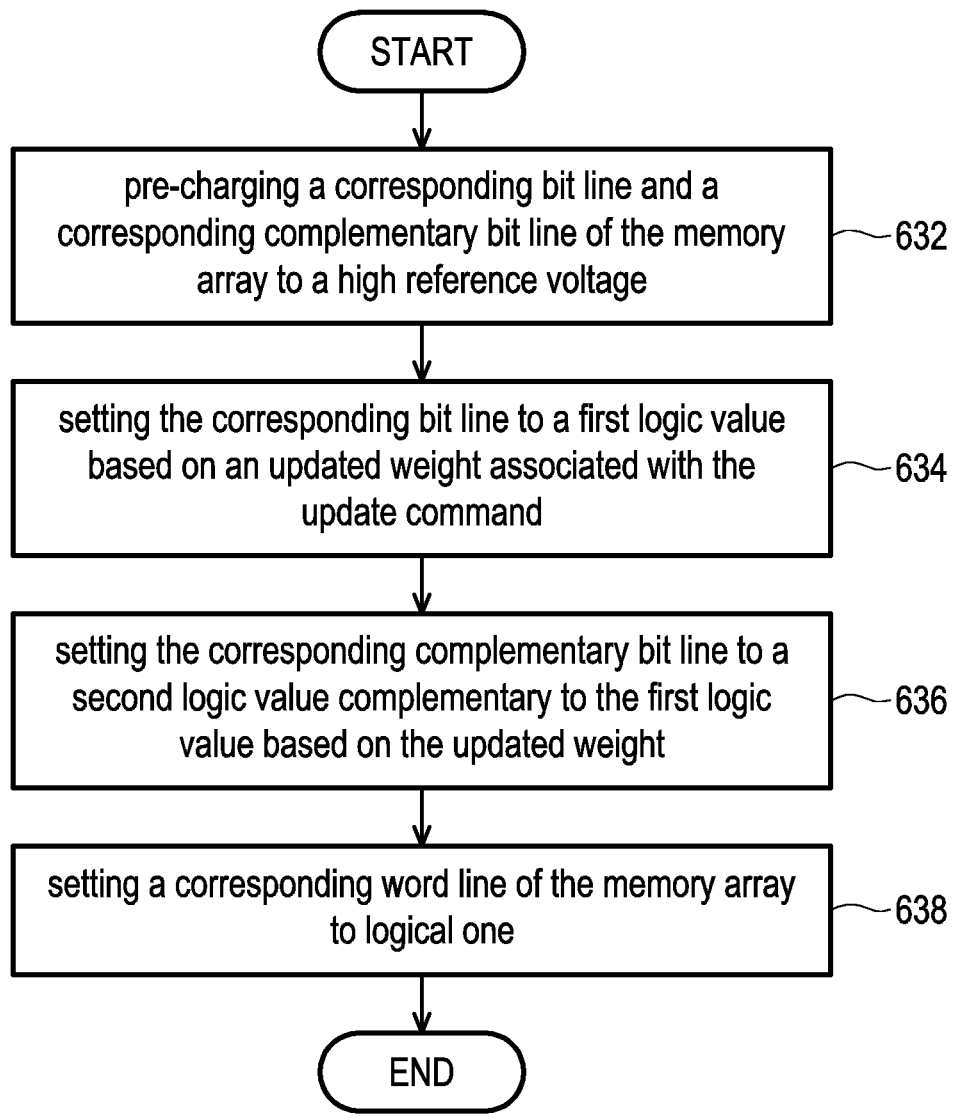
FIG. 7 is an exemplary flowchart of operations for performing the write operation in the method of FIG. 6, in accordance with some embodiments of the present disclosure.

FIG. 7 is an exemplary flowchart of operation 630 for performing the write operation, in accordance with some embodiments of the present disclosure. As shown in FIG. 7, in some embodiments, operation 630 includes operations 632, 634, 636 and 638. In operation 632, the memory controller pre-charges a corresponding bit line (e.g., write bit line WBL[j] in FIG. 4) and a corresponding complementary bit line (e.g., write bit line bar WBLB[j] in FIG. 4), which are associated with one of the memory cells for storing the updated weight, to a high voltage (e.g., power supply voltage VDD). In operation 634, the memory controller sets the corresponding bit line to a first logic value (e.g., logical one when writing data 1 or logical zero when writing data 0) based on an updated weight associated with the update command. In operation 636, the memory controller sets the corresponding complementary bit line to a second logic value (e.g., logical zero when writing data 1 or logical one when writing data 0) complementary to the first logic value based on the updated weight. In operation 638, the memory controller sets a corresponding word line (e.g., write word line WWL [i] in FIG. 4) associated with the memory cell for storing the updated weight to logical one.

Referring again to FIG. 6, if the memory controller does not receive the update command (operation 620—no), then in operation 640, the memory controller disables the write operation on the memory array, until receiving a next update command associated with a weight being changed. For example, the memory controller may bypass one or more operations 632, 634, 636, and 638 in FIG. 7 to disable the write operation. Particularly, the memory controller may disable operations included in operation 638 and set the corresponding word line associated with the memory cell(s) with an unchanged weight to logical zero or to a floating state. In some embodiments, in operation 640, the memory controller disables pre-charging the corresponding bit line and the corresponding complementary bit line associated with the memory cell(s) storing an unchanged weight (e.g., operations described in operation 632) and disables setting the corresponding bit line and setting the corresponding complementary bit line (e.g., operations included in operations 634 and 636). Accordingly, the corresponding bit line and the corresponding complementary bit line are kept in their previous state.

In some embodiments, in operation 650, the memory controller disables a read operation on the memory cells storing the weights for computation, regardless of receiving the update command or not. In other words, the memory controller does not perform random access to the memory cells storing weights in the memory array. That is, the memory controller operates in a "write only" mode and maintains the write bit line and the write bit line bar in their previous state, and does not charge the write bit line and the write bit line bar back to the high voltage (VDD) after the current write operation is completed.

By the operations described above, a method for performing an in-memory computation can be achieved to reduce the power consumption required for updating the weights stored in the memory and used for MAC operations by disabling pre-charging operations until the next command is received. Accordingly, the above method can improve the efficiency of MAC operations and reduce the overall power consumption required in various CIM applications in artificial intelligence systems. It will be appreciated that while the circuit architectures and methods described above are illustrated in connection with SRAM cells, the approach described herein may be applied to CIM devices using other types of memory cells.

In some embodiments, a method for performing an in-memory computation is disclosed. The method includes: storing data in memory cells of a memory array, the data including weights for computation; determining whether an update command to change at least one of the weights is received; in response to receiving the update command, performing a write operation on the memory array to update the changed weight; and disabling the write operation on the memory array until receiving a next update command to change the at least one of the weights.

In some embodiments, a computing device is disclosed. The computing device includes a memory array configured to store data including weights for computation, the memory array including memory cells grouped in rows and columns of memory cells, and a memory controller coupled to the memory array and configured to control the memory cells. The memory controller is configured to: in response to an update command, perform a write operation on the memory array to update at least one weight being changed; and disable the write operation on the memory array until a next update command is received.

In some embodiments, a memory controller is disclosed. The memory controller includes a command generating circuit configured to output an update command when one of weights for in-memory computing is to be replaced with a different weight, and a control circuit coupled to the command generating circuit and configured to disable a write operation on a memory array for storing the weights, until receiving the update command.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for performing an in-memory computation, comprising:
    storing data in a plurality of memory cells of a memory array, the data comprising a plurality of weights for computation;
    determining whether an update command to change at least one of the plurality of weights is received;
    in response to receiving the update command, performing a write operation on the memory array to update the changed weight; and
    disabling the write operation on the memory array until receiving a next update command to change at least one of the plurality of weights;
    wherein the update command is outputted when one of the plurality of weights is to be replaced with a different weight before the write operation is performed.

2. The method of claim 1, further comprising:
    disabling a read operation to the memory cells storing the plurality of weights for computation.

3. The method of claim 1, wherein performing the write operation comprises:
    pre-charging to a supply voltage a bit line and a complementary bit line associated with one of the memory cells for storing the updated weight;
    setting the bit line to a first logic value based on an updated weight associated with the update command;
    setting the complementary bit line to a second logic value complementary to the first logic value based on the updated weight; and
    setting a word line associated with the one of the memory cells of the memory array to logical one.

4. The method of claim 1, wherein disabling the write operation comprises:
    disabling pre-charging a bit line and a complementary bit line associated with one of the memory cells with an unchanged weight; and
    disabling setting the bit line and setting the complementary bit line.

5. The method of claim 1, wherein disabling the write operation comprises setting a word line associated with one of the memory cells with an unchanged weight to logical zero.

6. The method of claim 1, wherein disabling the write operation comprises setting a word line associated with one of the memory cells with an unchanged weight to a floating state.

7. The method of claim 1, further comprising:
    in response to receiving the update command associated with a first segment in the memory array, performing the write operation on the first segment and separately disabling the write operation on a second segment separate from the first segment in the memory array.

8. A computing device, comprising:
    a memory array configured to store data comprising a plurality of weights for computation, the memory array comprising a plurality of memory cells grouped in rows and columns of memory cells; and a memory controller coupled to the memory array and configured to control the memory cells, wherein the memory controller is configured to:
in response to an update command, perform a write operation on the memory array to update at least one weight being changed; and
disable the write operation on the memory array until a next update command is received;
wherein the update command is outputted when one of a plurality of weights is to be replaced with a different weight before the write operation is performed.

9. The computing device of claim 8, wherein the memory controller is configured to disable a read operation on the memory cells storing the plurality of weights for computation.

10. The computing device of claim 8, wherein the memory controller is configured to perform the write operation by:
pre-charging a bit line and a complementary bit line of the memory array associated with one of the memory cells for storing the updated weight;
setting the bit line to a first logic value based on an updated weight associated with the update command;
setting the complementary bit line to a second logic value complementary to the first logic value based on the updated weight; and
setting a word line associated with the one of the memory cells to logical one.

11. The computing device of claim 8, wherein the memory controller is configured to disable the write operation by:
disabling pre-charging a bit line and a complementary bit line associated with one of the memory cells with an unchanged weight; and
disabling setting the bit line and setting the complementary bit line.

12. The computing device of claim 8, wherein the memory controller is configured to disable the write operation by setting a word line associated with one of the memory cells with an unchanged weight to logical zero.

13. The computing device of claim 8, wherein the memory controller is configured to disable the write operation by setting a word line associated with one of the memory cells with an unchanged weight to a floating state.

14. The computing device of claim 8, wherein the memory controller is configured to perform the write operation on a first segment in the memory array and separately disable the write operation on a second segment separate from the first segment in the memory array, in response to the update command associated with the first segment.

15. The computing device of claim 8, further comprising a command generating circuit configured to output the update command when one of the plurality of weights is to be replaced with the different weight.

16. The computing device of claim 15, wherein the command generating circuit is coupled to the memory controller.

17. The computing device of claim 15, wherein the memory controller comprises the command generating circuit.

18. A memory controller, comprising:
a command generating circuit configured to output an update command when one of a plurality of weights for in-memory computing is to be replaced with a different weight before a write operation is performed on a memory array for storing the plurality of weights; and
a control circuit coupled to the command generating circuit and configured to disable the write operation on the memory array for storing the plurality of weights, until receiving the update command.

19. The memory controller of claim 18, wherein the control circuit is further configured to, in response to the update command, perform the write operation to update the one of the plurality of weights in the memory array.

20. The memory controller of claim 18, wherein the control circuit is configured to disable the write operation by:
disabling pre-charging a bit line and a complementary bit line associated with one of the memory cells with an unchanged weight; and
disabling setting the bit line and setting the complementary bit line.

* * * * *